United States Patent [19]

Schilling

[11] Patent Number: 5,192,710
[45] Date of Patent: Mar. 9, 1993

[54] METHOD OF MAKING A SEMICONDUCTOR LASER WITH A LIQUID PHASE EPITAXY LAYER AND A PLURALITY OF GAS PHASE OR MOLECULAR BEAM EPITAXY LAYERS

[75] Inventor: Michael Schilling, Stuttgart, Fed. Rep. of Germany

[73] Assignee: Alcatel N. V., Amsterdam, Netherlands

[21] Appl. No.: 692,378

[22] Filed: Apr. 30, 1991

[30] Foreign Application Priority Data

May 2, 1990 [DE] Fed. Rep. of Germany ....... 4014032

[51] Int. Cl.$^5$ ............................................. H01L 21/20
[52] U.S. Cl. .................................. 437/129; 437/126; 437/117
[58] Field of Search .................... 437/126, 129, 117

[56] References Cited

U.S. PATENT DOCUMENTS

| | | |
|---|---|---|
| 4,477,294 | 10/1984 | Gutierrez et al. ................... 437/117 |
| 4,966,863 | 10/1990 | Mizuochi et al. ................... 437/117 |
| 5,033,816 | 7/1991 | Blondeau et al. . |

FOREIGN PATENT DOCUMENTS

| | | | |
|---|---|---|---|
| 0321328 | 6/1989 | European Pat. Off. . | |
| 123126 | 9/1980 | Japan ................................ | 437/117 |
| 198789 | 9/1986 | Japan ................................ | 437/117 |
| 304614 | 12/1988 | Japan ................................ | 437/117 |

OTHER PUBLICATIONS

A. W. Nelson, et al., "Deformation-Free Overgrowth of InGaAsP DFB Corrugations", Electronics Letters, vol. 19, No. 2, Jan. 20, 1983.

Electronics Letters, Jul. 7th 1983, vol. 19, No. 14, H. Asahi et al., "Hybrid LPE/MBE-Grown InGaAsP-/InP DFB Lasers", pp. 507-509.

Japanese Journal of Applied Physics, vol. 22, No. 5, May, 1983, "Prevention of Surface Corrugation Thermal Deformation for InGaAsP/InP DFB Lasers", Haruo Nagai et al., L291-L293.

Patent Abstracts of Japan, vol. 14, No. 550, Dec. 1990.

*Primary Examiner*—Brian E. Hearn
*Assistant Examiner*—Linda J. Fleck
*Attorney, Agent, or Firm*—Spencer, Frank & Schneider

[57] ABSTRACT

A semiconductor laser which comprises a grating, a waveguide layer applied to the grating by LPE, and a plurality of layers disposed above the waveguide layer. This laser is characterized in that the layers disposed on the waveguide layer are applied with the aid of gas phase epitaxy or molecular beam epitaxy. Particularly preferred are MOVPE, MOMBE, GSMBE and CBE. Since the waveguide layer is applied with the aid of LPE directly onto the grating, the grating characteristics can be precisely predetermined. They remain intact during the application of the waveguide layer. The subsequent layers may be very thin. In particular, a very thin active layer or an MQW structure may be applied as the active layer. A buffer layer is provided between the waveguide layer and the active layer. A cladding layer and a ternary or quaternary contact layer lie above the active layer.

9 Claims, 1 Drawing Sheet

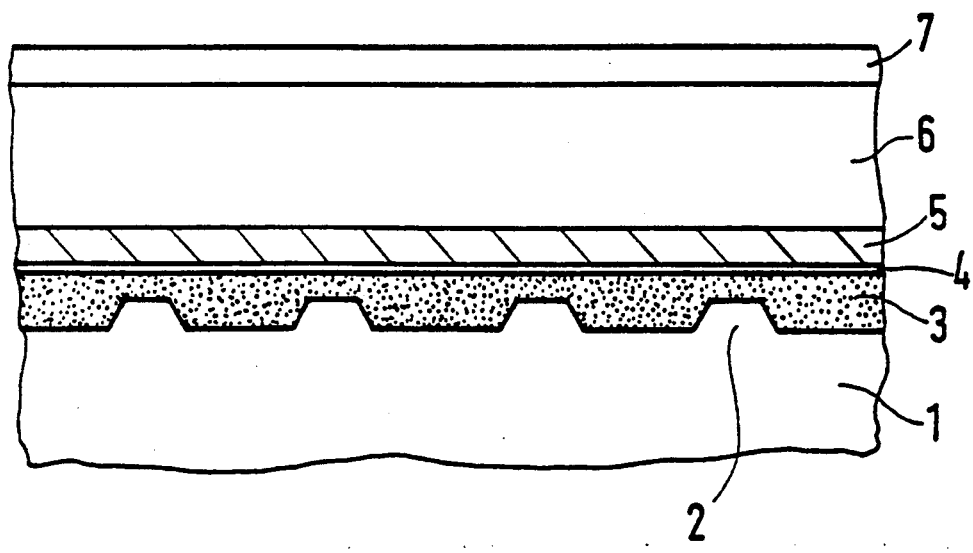

METHOD OF MAKING A SEMICONDUCTOR LASER WITH A LIQUID PHASE EPITAXY LAYER AND A PLURALITY OF GAS PHASE OR MOLECULAR BEAM EPITAXY LAYERS

CROSS REFERENCE TO RELATED APPLICATION

This application claims the priority of Application Ser. No. P 40 14 032.6, filed May 2, 1990, in the Federal Republic of Germany.

BACKGROUND OF THE INVENTION

The invention relates to a semiconductor laser comprising a grating and a waveguide layer applied to the grating by LPE (liquid phase epitaxy) as well as a plurality of layers disposed above the waveguide layer. Semiconductor lasers are known, particularly DFB (distributed feedback) lasers which have a flat first order grating that is preferably wet chemically etched. By way of MOVPE (metalorganic vapor phase epitaxy), a sequence of layers is applied to the grating, with a waveguide layer being grown directly on the grating. The application of the layers by MOVPE makes it possible to apply very thin active layers onto the waveguide layer which, particularly in connection with 1.55 μm lasers, results in a high quantum yield and high output power. However, the application of the waveguide layer to the grating by means of MOVPE is possible, without adversely affecting the grating, only if the depth of the grating is not particularly distinct. The outcome is then, however, that the coupling coefficient of the semiconductor laser is not the best.

It is known to improve the coupling coefficient by means of deep second order gratings, in which case the shape of the grating is preferably given a special configuration. That means, the slopes of the individual raised portions of the grating are inclined at a specific angle. Moreover, the top-to-bottom ratio and the depth of the grating are selected in such a manner that, as a whole, an optimum coupling coefficient results. This improves, in particular, feedback sensitivity of the semiconductor laser.

However, it has been found that the waveguide layer cannot be applied to such gratings by means of MOVPE. The temperatures required for this process have an adverse influence on the grating, that is, the individual ribs of the grating become rounded so that the values selected for the slope angle and the grating depth in order to obtain the optimum coupling coefficient no longer exist once the waveguide layer has been applied.

Moreover, it is not possible to apply very thin active layers to the waveguide layer by LPE and therefore the quantum yield and the optical output power of a laser produced by LPE are insufficient. An added drawback of LPE is that a dissolution preventing layer must additionally be applied to the active layer before further layers are grown. This increases the effective thickness of the active layer.

SUMMARY OF THE INVENTION

Based on this prior art, it is an object of the invention to provide a semiconductor laser and a method of producing it in which the feedback sensitivity is reduced, with a high quantum yield being attainable.

This is accomplished in connection with a semiconductor laser including a substrate and a grating on the substrate and a waveguide layer applied to the grating by LPE, and a plurality of layers disposed on the waveguide layer, wherein the plurality of layers disposed on the waveguide layer are formed by means of gas phase or molecular, beam epitaxy.

Due to the fact that the waveguide layer is applied to the grating by LPE, the structures of the grating remain intact while simultaneously optimum planarity is realized. That means that the recesses existing between the grating ribs are filled, the thicknesses of the waveguide layers above the ribs are very slight. Due to the fact that the layers above the waveguide layer are applied by means of a gas phase or molecular beam process, it is possible, in contrast to LPE, to apply very thin layers, particularly a very thin active layer. Thus, the desired characteristics of the laser can be attained: a high quantum yield and high output power with very low feedback sensitivity. The threshold current is very low. Finally, stable monomode operation is ensured.

Preferred is a semiconductor laser in which the grating is a second order DFB grating. Preferably, the coupling coefficient is optimized in that the slope angle, the top-to-bottom ratio as well as the depth of the grating are matched in a known manner. Due to the fact that this relatively deep grating is provided with a waveguide layer by LPE, the structure of the grating remains optimally intact. Since the subsequent layers are applied by gas phase or molecular beam epitaxy, the desired thin layer thicknesses can be realized, resulting in the mentioned advantages.

Further features of the semiconductor laser are defined in the remaining dependent claims.

The problem is additionally solved by a method of producing a semiconductor laser by providing a substrate having a grating on a surface of the substrate, and a waveguide layer on the grating by LPE and disposing a plurality of layers on the waveguide layer by growing the plurality of layers on the waveguide layer by means of a gas phase or a molecular beam epitaxy process.

The first layer above the grating is applied by LPE. In this way, it is possible to obtain the desired and set grating structures which are preferably realized in a dry-etching process. At the same time, optimum planarity is realized with a small overall thickness of the waveguide layer.

Furthermore, very thin layers can be applied onto this waveguide layer with the aid of gas phase or molecular beam epitaxy, with MOVPE being suitable as the gas phase process and MOMBE [metalorganic molecular beam epitaxy], GSMBE [gas source molecular beam epitaxy] or CBE [chemical beam epitaxy] as the molecular beam epitaxy process.

In this way, it is possible to apply very thin layers, particularly a thin active layer.

In this way, a high quantum yield and also high output power can be realized together with reduced feedback sensitivity.

Further embodiments of the method are defined in the dependent claims.

BRIEF DESCRIPTION OF THE DRAWINGS

The invention will now be described in greater detail with reference to the sole drawing figure which is a basic sectional sketch of a laser. The section is here made parallel to the propagation direction of the light; it actually is a cross-sectional view of a wafer from which lasers of the type to be described below are to be produced.

DETAILED DESCRIPTION OF THE PREFERRED EMBODIMENT

The sectional view shows that a DFB grating 2 is applied onto an InP substrate 1. Preferably a dry etching process is employed for this purpose. It may be produced, for example, by ion bombardment. Preferably, the grating is configured in such a way that an optimum coupling coefficient results; that is, the top-to-bottom ratio of the grating, its depth and angle of inclination of the slopes of the raised grating portions are selected specifically.

It is of particular advantage that the waveguide layer 3 is applied by LPE so that the grating structure remains intact. In particular, deformations of the grating are avoided. At the same time, optimum planarity results; that is, due to the distinctly lateral layer growth during LPE, the recesses in the grating between the ribs are filled completely so that the originally ribbed wafer surface becomes completely planar.

The layers disposed on waveguide layer 3 are not applied by LPE but with the aid of gas phase or molecular beam epitaxy. MOVPE has been found to be a suitable gas phase process and MOMBE, GSMBE or CBE have been found to be suitable molecular beam epitaxy processes.

The two mentioned types of processes are distinguished by the fact that they permit the application of particularly thin layers.

Initially a very thin InP buffer layer 4 can be applied to waveguide layer 3. This buffer layer has a thickness of, for example, less than 0.1 $\mu$m. It serves to improve the quality of the semiconductor laser and as an etch-stop layer during further structuring of the semiconductor laser, for example, for the integration with waveguide components.

An active layer 5 is applied over the buffer layer. This active layer may be quaternary, but may also be composed of an MQW (multi quantum well) layer sequence. In the latter case, numerous particularly thin layers of different materials are applied on top of one another, with their total thickness approximately corresponding to the thickness of the active layer 5. Preferably InP and InGaAs layers are applied alternatingly.

With the aid of such layers, the quantum yield can be increased even further.

The active layer is coated by means of the stated methods with a cladding layer 6, preferably an InP layer, whereupon a highly doped contact layer 7 of ternary or quaternary material is applied.

The further processing of the wafer into lasers takes place according to conventional manufacturing methods.

The combination of the coating processes mentioned here permits the improvement of, in particular, the characteristics of 1.55 $\mu$m DFB high speed lasers without making the manufacturing process significantly more expensive. As a whole, the invention provides a simple manufacturing process for lasers, particularly for a DFB laser having a hybrid epitaxially produced layer structure which operates stably in monomode operation and with which reduced feedback sensitivity can be realized together with a very good quantum yield. The threshold current of the laser is very low.

The positive combination of epitaxy processes results in an optimum combination of the advantages of these processes. In particular, the layers serving as waveguides, the waveguide layer and the active layer, are produced with the aid of different epitaxy processes, with the waveguide layer being produced by LPE and the active layer by gas phase epitaxy and molecular beam epitaxy, respectively. Thus, the structure of the grating adjacent the waveguide layer is not adversely influenced, permitting an optimum coupling coefficient to be set.

It will be understood that the above description of the present invention is susceptible to various modifications, changes and adaptations, and the same are intended to be comprehended within the meaning and range of equivalents of the appended claims.

What is claimed is:

1. In a method of producing a semiconductor laser comprising the steps of
   providing a substrate having a diffraction grating on a surface of the substrate, forming a waveguide layer on the grating, and disposing a plurality of layers on the waveguide layer; the improvement wherein said step of forming a waveguide layer on the grating comprises forming the waveguide layer by liquid phase epitaxy, and wherein said step of disposing comprises growing the plurality of layers on the waveguide layer by means of one of a gas phase and a molecular beam epitaxy process.

2. A method according to claim 1, wherein MOVPE is employed as the gas phase epitaxy process.

3. A method according to claim 2, wherein a molecular beam epitaxy process comprising one of MOMBE, GSMBE and CBE is used for said step of growing the plurality of layers.

4. A method according to claim 1 wherein said step of growing the plurality of layers includes sequentially growing an active layer, a cladding layer and a contact layer on said waveguide layer.

5. A method according to claim 1 wherein said step of providing a substrate having a diffraction on a surface of the substrate includes providing a substrate having a second order distributed feedback grating on the substrate surface.

6. A method according to claim 1 wherein said step of growing the plurality of layers includes sequentially growing a buffer layer on the waveguide layer, an active layer on the buffer layer, a cladding layer on the active layer, and a contact layer on the cladding layer.

7. A method according to claim 6 wherein: said step of forming a waveguide layer includes forming a quaternary waveguide layer on the grating; and said step of growing a plurality of layers includes growing the active layer of one of a quaternary material and a multi quantum well layer sequence, and growing the contact layer of one of a ternary material and a quaternary material on said cladding layer.

8. A method according to claim 7 wherein said step of growing the active layer comprises growing a multi quantum well layer sequence.

9. A method according to claim 8 wherein the substrate, the buffer layer and the cladding layer are each formed of InP and the multi quantum well layer sequence of the active layer is formed of alternating layers of InP and InGaAs.

* * * * *